(12) United States Patent
Ling et al.

(10) Patent No.: US 7,040,934 B2
(45) Date of Patent: May 9, 2006

(54) ADD-IN CARD TO BACKPLANE CONNECTING APPARATUS

(75) Inventors: Yun Ling, Portland, OR (US); Jason A. Mix, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/324,941

(22) Filed: Dec. 19, 2002

(65) Prior Publication Data

US 2004/0121655 A1    Jun. 24, 2004

(51) Int. Cl.
*H01R 13/10* (2006.01)
(52) U.S. Cl. ..................... 439/682; 439/108
(58) Field of Classification Search ............... 439/682, 439/636, 637, 108, 951
See application file for complete search history.

(56) References Cited

U.S. PATENT DOCUMENTS

| | | | | |
|---|---|---|---|---|
| 3,396,461 A | * | 8/1968 | Spooner et al. ............... 29/827 |
| 4,736,275 A | * | 4/1988 | Kendall et al. ............. 361/767 |
| 5,024,609 A | * | 6/1991 | Piorunneck ................. 439/637 |
| 5,026,292 A | * | 6/1991 | Pickles et al. .............. 439/108 |
| 5,259,768 A | * | 11/1993 | Brunker et al. ............... 439/60 |
| 5,611,057 A | * | 3/1997 | Pecone et al. .............. 710/301 |
| 5,618,191 A | * | 4/1997 | Chikano et al. ............ 439/108 |
| 5,997,312 A | * | 12/1999 | Ho et al. ...................... 439/60 |
| 6,638,081 B1 | * | 10/2003 | Korsunsky et al. ........... 439/79 |

* cited by examiner

*Primary Examiner*—Thanh-Tam Le
(74) *Attorney, Agent, or Firm*—Blakely, Sokoloff, Taylor & Zafman LLP

(57) ABSTRACT

In one embodiment of the invention, the apparatus includes a socket connector to connect to a backplane to receive an electronic device. The socket connector includes a plurality of pairs of signal contacts to receive signals from the electronic device, and a plurality of ground frames to ground the electronic device. The ground frames are to connect to a ground plane of the electronic device. The socket connector also includes a set of one or more ground pins to connect to the ground plane, wherein each one of the set is between each of the pairs of signal contacts.

18 Claims, 7 Drawing Sheets

ADD-IN CARD TO BACKPLANE CONNECTING APPARATUS

BACKGROUND

1. Field

Embodiments of the invention relate to the field of electrical connectors, and more specifically, to add-in card to backplane connectors.

2. Background

Driven by increasing bandwidth demands, computer bus speeds continue to increase. Currently, numerous buses operate at multiple Gigabits per second. These multiple Gigabit buses demand relatively high connector performance. In particular, as bus speeds increase, relatively high connector cross-talk performance becomes increasingly difficult to achieve at relatively reasonable costs. For example, it is typically difficult to achieve 1–3% crosstalk at multiple Gigabit frequencies, while keeping productions costs to a relatively reasonable level.

Currently, relatively high performance backplane connectors achieve relatively low cross-talk using ground planes and ground pins to isolate electromagnetic fields. For example, pin-and-socket type backplane connectors employ both internal ground planes and ground pins. Beam-and-blade board-to-board type connectors also employ internal ground planes to reduce crosstalk. However, these internal ground plane connectors are not suitable for use in desktop computers because of their relatively high cost and unsuitable form factor.

Another prior art connector type uses multi-level contacts for reducing crosstalk. FIG. 1 illustrates a prior art socket for receiving prior art add-in cards. In FIG. 1, the socket 100 includes a housing 102. Inside the housing 102, the socket includes a first row of low-level ground contacts 104 for grounding an add-in card. The socket also includes a second row of high-level signal and ground contacts 106. In the second row of contacts, at certain intervals, the high-level signal contacts are separated by high-level ground contacts to reduce crosstalk between the signal contacts.

FIG. 2 illustrates a prior art add-in card. In FIG. 2, a prior art add-in card 200 includes two sets of edge fingers 202. Each set of edge fingers 202 includes a row of low-level ground contacts 204, which make contact with the socket's low-level ground contacts 104, when the add-in card 200 is plugged into the socket 100. Each edge finger set also includes a row of high-level signal and ground contacts 206, which mate (i.e., make contact with) with the socket's high-level signal and ground contacts 106, when the add-in card 200 is plugged into the socket 100.

As shown in FIG. 1, one disadvantage of the prior art socket 100 is that its adjacent signal contacts are not always uniform. As such, delay errors can be introduced into signals passing through the signal contacts 106. Another disadvantage of the prior art socket is that the low-level ground contacts 104 do not provide effective crosstalk protection at high bus speeds.

BRIEF DESCRIPTION OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
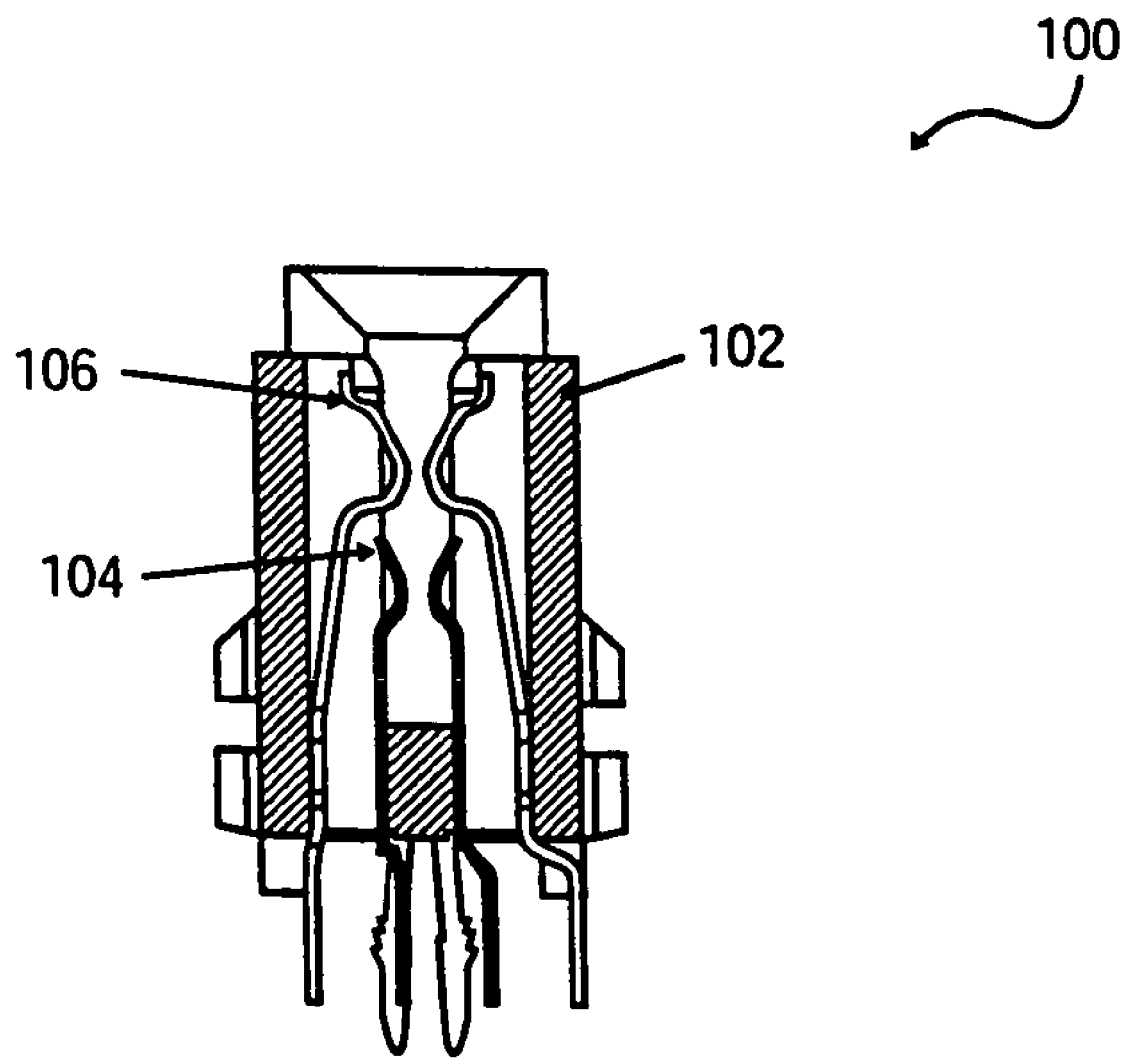
FIG. 1 illustrates a prior art socket for receiving prior art add-in cards.
Figure 2:
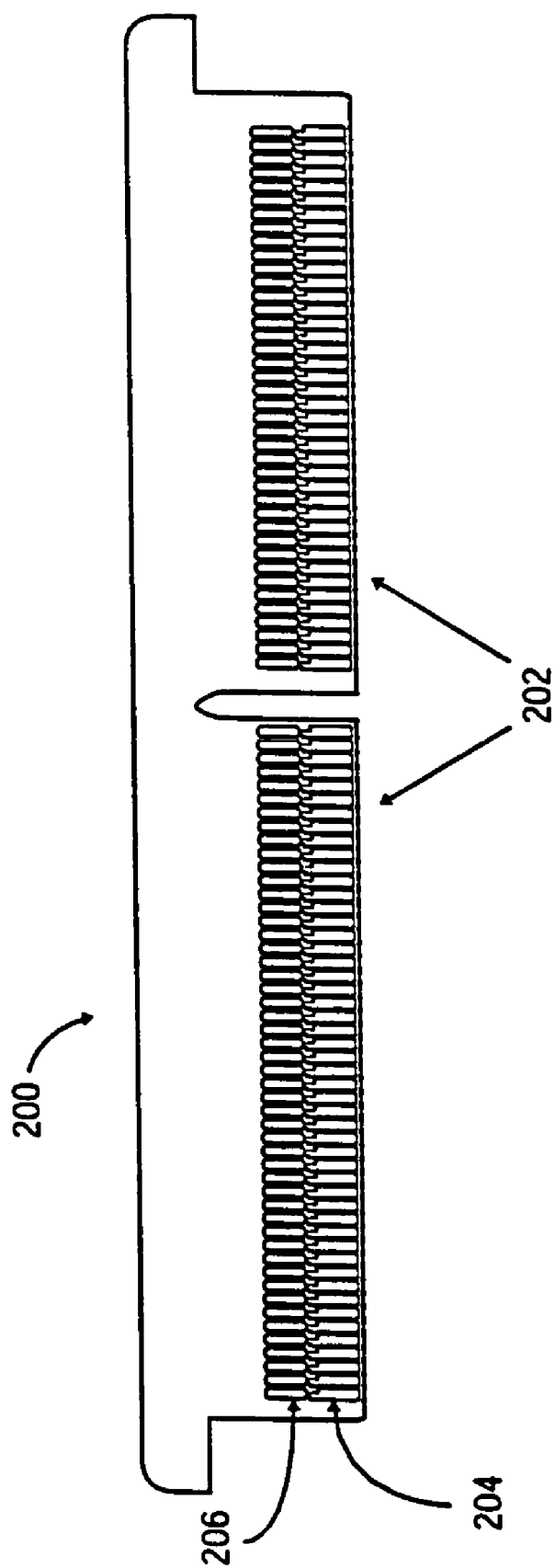
FIG. 2 illustrates a prior art add-in card.
Figure 3:
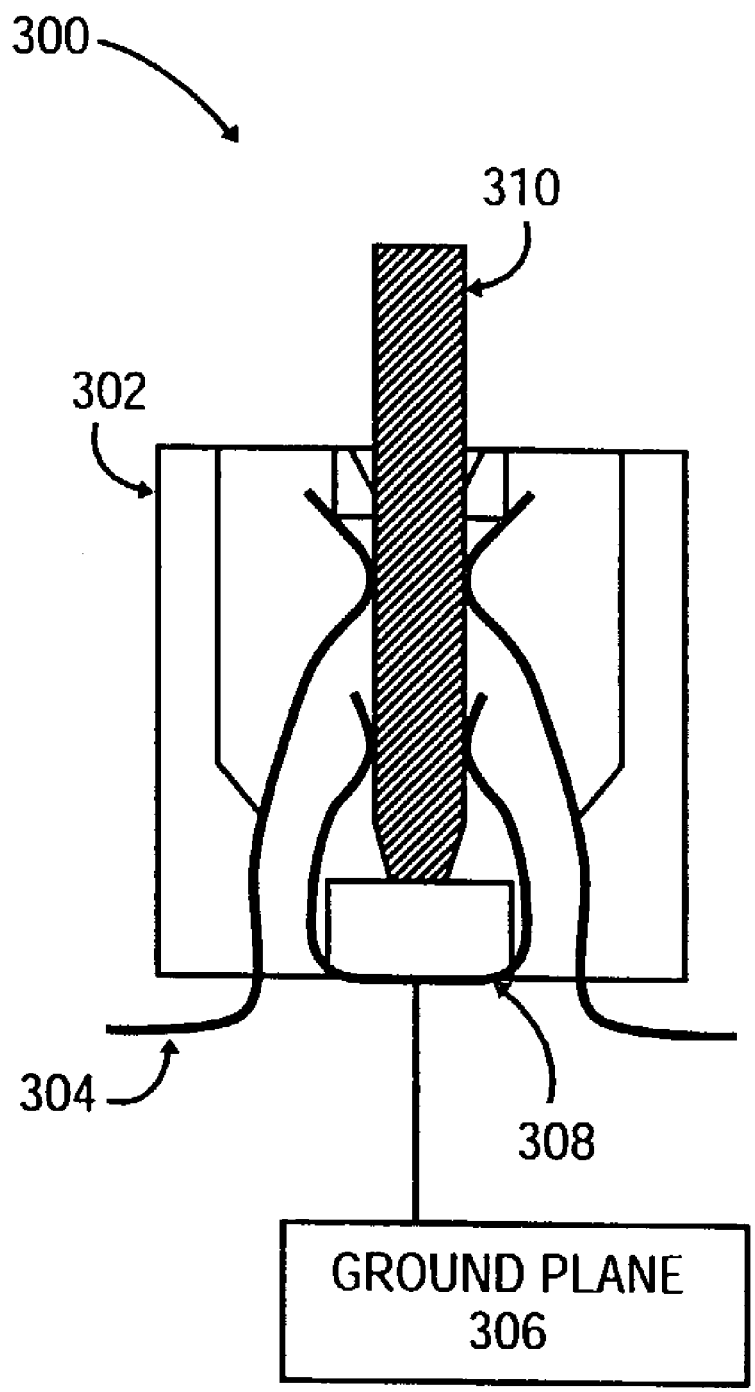
FIG. 3 is a cross-sectional view of a connector socket, according to embodiments of the invention.

FIG. 3 is a cross-sectional view of a connector socket, according to embodiments of the invention. The connector socket 300 is to be connected to a backplane, motherboard, or other circuit board, as described in more detail below. As shown in FIG. 3, the connector socket 300 includes a socket housing 302, which provides structural support for the components contained therein. The socket housing 302 can be made from any suitable material. For example, in one embodiment of the invention, the housing is made of thermoplastics. The connector socket housing 302 contains signal contacts 304, which send and/or receive signals to/from an add-in card. In one embodiment of the invention, the signal contacts 304 receive differential signals. A differential signal is a signal that is phase shifted one hundred eighty degrees and carried on two separate conductors. Moreover, differential signals are typically transmitted together over conductors having substantially the same length. The signal contacts 304 can be made from any suitable conductive material. For example, the signal contacts 304 can be made from copper alloys or other suitable conducting metals, plated with gold or other surface finishing materials. In one embodiment of the invention, the signal contacts 304 are surface-mounted to a backplane. For example, the signal contacts 304 are soldered to a backplane mounting pad. A backplane mounting pad can be an exposed metal surface of the backplane (e.g., a section of the backplane where solder mask has been etched away to expose a metal surface) with suitable finishing for solderability. In one embodiment of the invention, the backplane mounting pad can be connected to a high-speed signal line that runs on the surface of the backplane. Alternatively, the backplane mounting pad can be connected to a signal line disposed within the backplane using vias. Vias are conducting lines in form of through-holes that run transverse to the mounting plane, connecting surface lines, pads, etc. to lines, pads, etc. contained within the backplane.

The connector socket 300 also includes ground frames 308, which are disposed within the socket housing 302. The ground frames 308 are to be connected to a backplane's ground plane 306 to ground the ground frame 308. As shown in FIG. 3, in one embodiment of the invention, the ground frames 308 act as shields to isolate the signal contacts 304, preventing crosstalk between opposing signal contacts 304 (i.e., preventing crosstalk between the signal contacts 304 on the left with those on the right). The ground frames 308 also aid in keeping the impedance of the socket connector 300 substantially constant. In one embodiment of the invention, the ground frames 308 are shaped to provide a substantially constant geometry in relation to the signal contacts 304. The ground frames 308 will be described in more detail below, with reference to FIG. 5.

An add-in card 310 is shown in FIG. 3 to illustrate how the signal contacts 304 and the ground frames 308 contact the add-in card 310, although it is not part of the connector socket 300. As shown in FIG. 3, the signal contacts 304 are taller than the ground frames 308; therefore the signal contacts 304 and ground frames 308 mate with the add-in card 308 at different heights. The socket 300 also includes ground pins, which are not illustrated in FIG. 3. In one embodiment of the invention, the ground pins are identical in form to the signal contacts 304. That is, the ground pins are identically disposed within the socket housing 302 and are of an identical size. Alternatively, the ground pins may not be identical to the signal contacts 304. In one embodiment of the invention, the ground pins are to make contact with the add-in card 310 at the same height as the signal contacts 304. The ground pins are interspersed between the signal contacts 304, as shown in FIG. 4.

Figure 4:
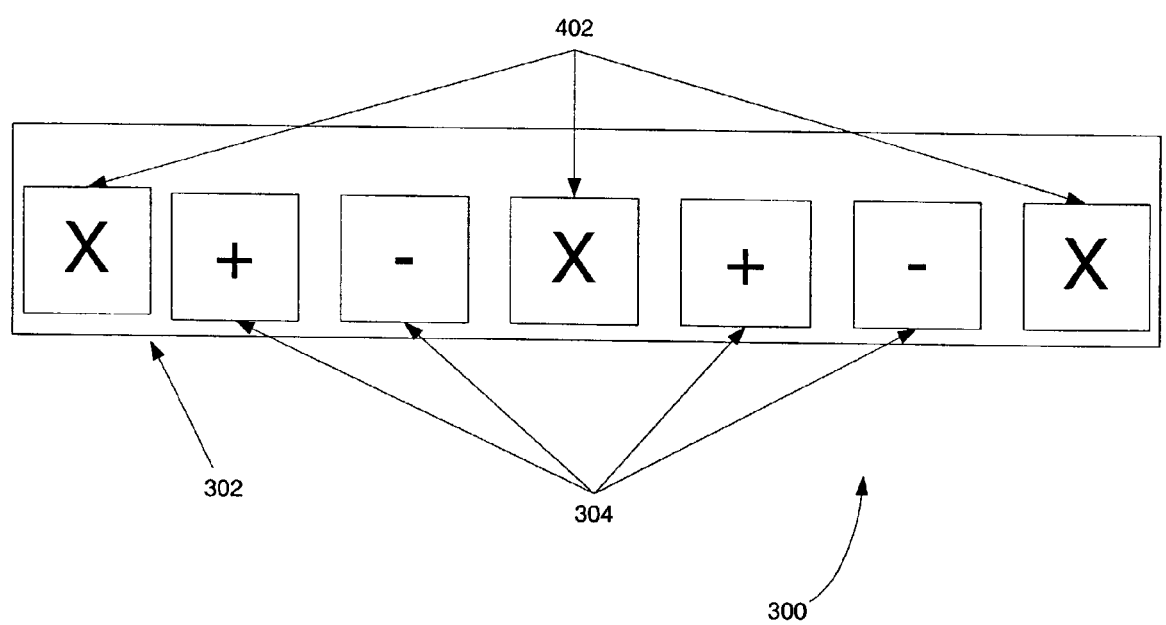
FIG. 4 illustrates a layout of ground pins and signal contacts, according to embodiments of the invention.

FIG. 4 illustrates a layout of ground pins and signal contacts, according to embodiments of the invention. FIG. 4 will be described with reference to the exemplary socket connector of FIG. 3. As shown in FIG. 4, in one embodiment of the invention, each ground pin 402 separates a pair of signal contacts 304. In an alternative embodiment of the invention, there is more than one ground pin separating the signal contacts. In one embodiment of the invention, each pair of signal contacts 304 transmits and/or receives differential signals, as noted above. The ground pins 402 are to be connected to the ground plane 306 (not shown). In one embodiment of the invention, the ground pins 402 are made of copper alloy platted with gold, while other embodiments of the invention call for other suitable materials. Different embodiments of the invention call for varying numbers of signal contacts 304 and ground pins 402.

Figure 5:
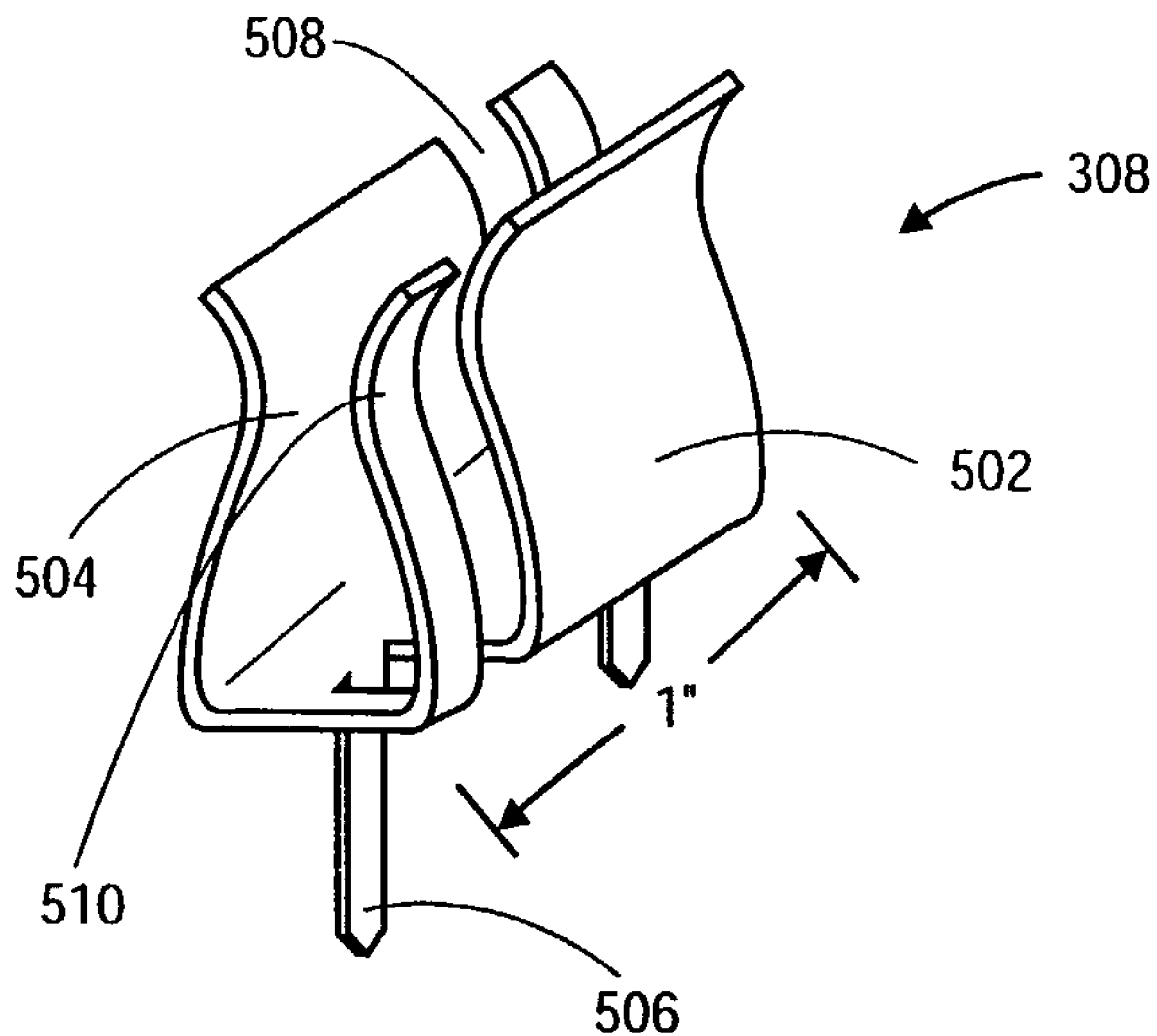
FIG. 5 is an angled view of a ground frame, according to embodiments of the invention.

FIG. 5 is an angled view of a ground frame, according to embodiments of the invention. In FIG. 5, the ground frame 308 is shown outside the socket housing 302. FIG. 5 will be described with reference to the exemplary socket of FIG. 3. In one embodiment of the invention, the ground frame 308 is approximately one inch long. However, the ground frame 308 can be longer or shorter, according to alternative embodiments of the invention. In one embodiment of the invention, referring to FIG. 4, each ground frame 308 spans the length of two ground pins 402 and two of signal contacts 304. As shown in FIG. 5, the ground frame 308 includes a ground frame body 502, which is the largest component of the ground frame 308.

As shown in FIG. 5, in one embodiment of the invention, the ground frame body 502 is contoured into an hourglass-like shape to form a contact area 504. The contact area 504, which is to make contact with an add-in card 310, is located along the ground frame body's inner surface. According to alternative embodiments of the invention, the ground frame 308 can be any suitable shape, so long as it can make suitable contact with appropriate areas of the add-in card 310.

The ground frame 308 also includes gaps 508 between the ground frame body 502 and its end pieces 510. In an alternative embodiment of the invention, the ground frame body 502 does not include the gaps 508 and end pieces 510 (i.e., the ground frame body is one continuous structure without gaps). The ground frame 308 also includes mounting tails 506 attached to the ground frame body 502. As shown in FIG. 5, the mounting tails 506 are located underneath the base of the ground frame body 502. In one embodiment of the invention, the ground frame 308 is inexpensively made from a single piece of sheet metal, where parts of the ground frame body 502 have been cut and shaped into the mounting tails 506. In one embodiment of the invention, the sheet metal is a copper alloy. In one embodiment of the invention, the contact area 504 is plated with gold, tin, or other suitable conductive material. The mounting tails 506 are to be connected to a ground plane 306 of a backplane, motherboard, or other circuit board, as noted above. In one embodiment of the invention, the mounting tails 506 are to be through-hole soldered to the backplane, connecting the ground frame 308 to the backplane's ground plane 306. In one embodiment of the invention, the ground frame 308 is through-hole soldered to the backplane by the paste-in-hole process. In an alternative embodiment of the invention, the ground frame 308 is mounted to the backplane by a press-fit process. Different embodiments of the invention call for varying numbers of ground frames 308.

Figure 6:
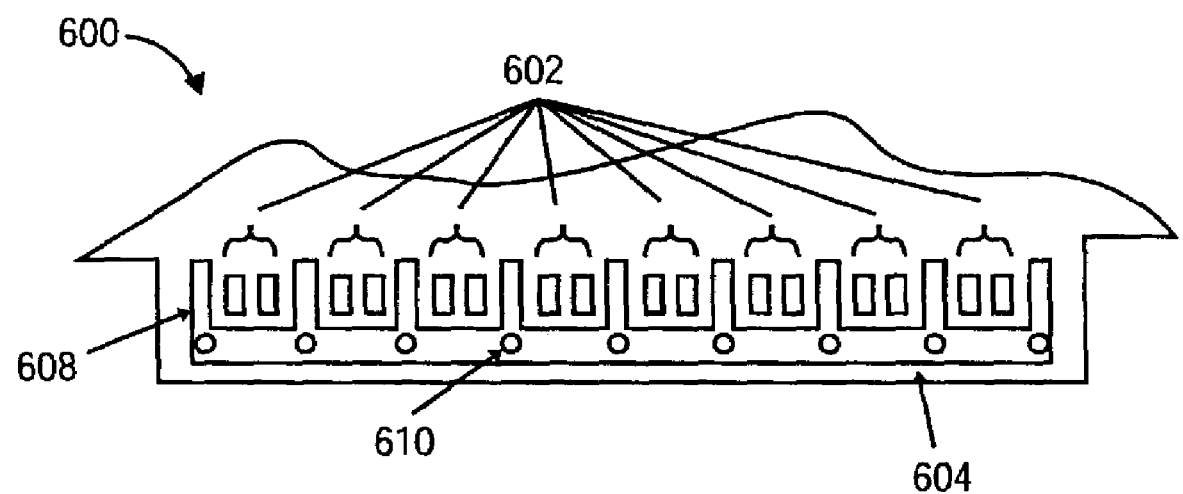
FIG. 6 is a side view of an add-in card including a ground bar, according to embodiments of the present invention.

FIG. 6 is a side view of an add-in card including a ground bar, according to embodiments of the invention. FIG. 6 will be described with reference to the exemplary socket connector of FIGS. 3 and 4. As shown in FIG. 6, the add-in card 600 includes a number of pairs of signal pads 602 to transmit and/or receive signals to/from a backplane. In one embodiment of the invention, the signal pads 602 transmit and/or receive differential signals. In particular, the signal pads 602 are to mate with the signal contacts 304 of the connector socket 300.

The add-in card 600 also includes a ground bar 604, which is connected to a ground plane (not shown) disposed within the add-in card 600. In one embodiment of the invention the ground bar 604 is connected to the add-in card ground plane by vias 610. In one embodiment of the invention, a via 610 is located at every place a where a ground pad 608 is connected to the ground bar 604. Alternatively, the vias can be at the top of the ground pads 608 or spaced at other points on the ground bar 604. As shown in FIG. 6, in one embodiment of the invention, the ground bar 604 is one continuous piece of metal. In an alternative embodiment of the invention, the ground bar 604 includes a number of interconnected metal pads. The add-in card 600 also includes ground pads 608, which are perpendicularly oriented relative to the ground bar 604, as shown in FIG. 6. The ground pads 608 are connected to the ground bar 604. In one embodiment of the invention, the ground pads 608 are made of copper alloy platted with gold. However, alternative embodiments of the invention call for other suitable materials. The ground pads 608 help to substantially reduce contacts 304, sucstantially reducing crosstalk between adjacent pairs of signal contacts 304.

Figure 7:
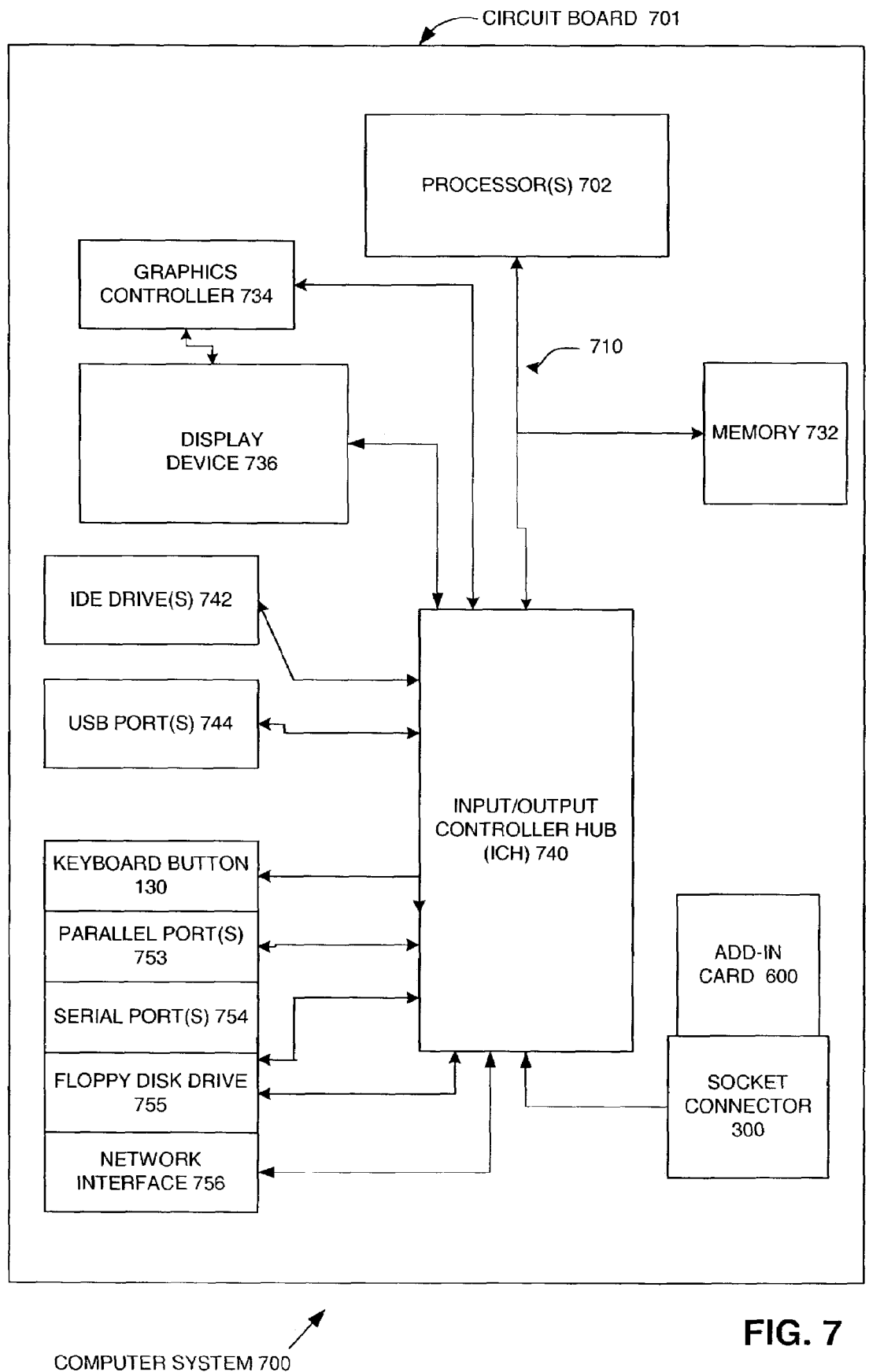
FIG. 7 is a computer system including a socket connector and add-in card, according to embodiments of the invention.

FIG. 7 illustrates an exemplary system comprising a socket connector and add-in card, according to embodiments of the invention. Although described in the context of system 700, the present invention may be implemented in any suitable computer system comprising one or more integrated circuits.

As illustrated in FIG. 7, computer system 700 comprises a circuit board 701, on which the following components are arranged. The computer system includes processor(s) 702. Computer system 700 also includes a memory 732, processor bus 710 and input/output controller hub (ICH) 740. The processor(s) 702, memory 732 and ICH 740 are coupled to the processor bus 710. The processor(s) 702 may comprise any suitable processor architecture and for one embodiment of the invention comprise an Intel® Architecture used, for example, in the Pentium® family of processors available from Intel® Corporation of Santa Clara, Calif. For other embodiments of the invention, computer system 700 may comprise one, two, three, or more processors, any of which may execute a set of instructions that are in accordance with embodiments of the present invention.

The memory 732 stores data (e.g., image data) and/or instructions, and may comprise any suitable memory, such as a dynamic random access memory (DRAM), for example. A graphics controller 734 controls the display of information display device 736.

The input/output controller hub (ICH) 740 provides an interface to I/O devices or peripheral components for computer system 700. The ICH 740 may comprise any suitable interface controllers to provide for any suitable communication link to the processor(s) 702, memory 732 and/or to any suitable device or component in communication with the ICH 740. For one embodiment of the invention, the ICH 740 provides suitable arbitration and buffering for each interface. The ICH 740 is also connected to an add-in card 400. In one embodiment of the invention, the add-in card 400 is connected to the circuit board 701 with a socket connector 300.

For one embodiment of the invention, the ICH 740 provides an interface to one or more suitable integrated drive electronics (IDE) drives 742, such as a hard disk drive (HDD) or compact disc read only memory (CD ROM) drive for example, to store data and/or instructions for example, one or more suitable universal serial bus (USB) devices through one or more USB ports 744. For one embodiment of the invention, the ICH 740 also provides an interface to a keyboard 751, a mouse 752, a floppy disk drive 755, one or more suitable devices through one or more parallel ports 753 (e.g., a printer), and one or more suitable devices through one or more serial ports 754.

Thus an add-in card to backplane connecting apparatus has been described. While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. An apparatus comprising:
  a socket connector to connect to a backplane and to receive an electronic device, the socket connector including:
    a plurality of pairs of signal contacts disposed on opposing sides of an upper portion of the socket connector to receive signals from the electronic device, each of the pairs of signal contacts having a first contact to receive first differential phase signals and a second contact to receive second differential phase signals;
    a plurality of ground pins to connect to a ground plane of the backplane, wherein one of the ground pins is between each of the pairs of signal contacts; and
    a plurality set of ground frames disposed below the plurality of pairs of signal contacts to connect to the ground plane and to isolate the opposing plurality of pairs of signal contacts from each other, wherein each ground frame spans at least a length of two ground pins and two pairs of signal contacts, and wherein the each ground frame is soldered to each through-hole of the backplane.

2. The apparatus of claim 1, wherein each of the ground frames is approximately one inch long.

3. The apparatus of claim 1, wherein the electronic device is an add-in card.

4. The apparatus of claim 1, wherein the ground frames are formed from sheet metal.

5. The apparatus of claim 1, further comprising a second ground pin between each of the pairs of signal contacts.

6. An apparatus comprising:
  a plurality of pairs of signal contacts disposed on opposing sides of an upper portion of the socket connector connected to a backplane, each of the pairs of signal contacts having a first contact to receive first differential phase signals and a second contact to receive second differential phase signals;
  a plurality of ground pins to connect to a ground plane of the backplane, wherein each ground pin is between each of the pairs of signal contacts;
  a plurality set of ground frames disposed in the socket connector below the plurality of pairs of signal contacts to connect to the ground plane of the backplane, wherein each ground frame spans at least a length of two ground pins and two pairs of signal contacts and wherein the each ground frame is soldered to each through-hole of the backplane;
  a plurality of pairs of signal pads of an add-in card to insert in the socket connector, wherein the pairs of signal pads to mate with the pairs of signal contacts of the socket connector;
  a ground bar of the add-in card coupled to a ground plane of the add-in card, the ground bar to mate with the set of one or more ground frames in the socket connector; and
  a plurality of ground pads perpendicularly coupled to the ground bar and each located between each pair of signal pads, wherein the ground pads to mate with the ground pins of the socket connector.

7. The apparatus of claim 6, wherein the ground bar is connected to a first ground plane of the add-in card.

8. The apparatus of claim 6, where the ground frames are connected to a second ground plane of the backplane.

9. The apparatus of claim 6, wherein the backplane includes a processor.

10. The apparatus of claim 6, wherein the ground frames are approximately one inch long.

11. A system comprising:
  a circuit board;
  a random access memory unit coupled to the circuit board;
  a processor coupled to the circuit board and coupled to the random access memory unit;
  a socket connector coupled to the circuit board, the socket connector including:
    a plurality of pairs of signal contacts disposed on opposing sides of an upper portion of the socket connector to receive signals from the electronic device, each of the pairs of signal contacts having a first contact to receive first differential phase signals and a second contact to receive second differential phase signals;
    a plurality of ground pins to connect to a ground plane of the backplane, wherein one of the ground pins is between each of the pairs of signal contacts; and
    a plurality set of ground frames disposed below the plurality of pairs of signal contacts to connect to the ground plane and to isolate the opposing plurality of pairs of signal contacts from each other, wherein each ground frame spans at least a length of two ground pins and two pairs of signal contacts, and wherein the each ground frame is soldered to each through-hole of the circuit board.

12. The system of claim 11, wherein the ground frames are approximately one inch long.

13. The system of claim 11, wherein the electronic device is an add-in card.

14. The system of claim 11, wherein the ground frames are formed from sheet metal.

15. The system of claim 11 further comprising:
an add-in card coupled to the socket connector, the add-in card including,
a plurality of pairs of signal pads to transmit signals;
a ground bar; and
a plurality of ground pads connected to the ground bar, wherein one of the ground pads is between each of the pairs of signal pads.

16. A method comprising:
receiving differential signals from an add-in card disposed in a socket connector coupled to a circuit board, wherein the differential signals are received by a plurality of pairs of signal contacts disposed in an upper portion of the socket connector, each of the pairs of signal contacts having a first contact to receive first differential phase signals and a second contact to receive second differential phase signals, wherein each of the pairs of signal contacts is separated by a ground pin; and
grounding electricity through a plurality set of ground frames disposed below the pairs of signal contacts within the socket connector, wherein the ground frames are connected to a ground plane of the circuit board and spans at least two pairs of signal contacts, and wherein the ground frames are soldered to through-holes of the circuit board.

17. The method of claim 16, wherein the ground frames are approximately one inch long.

18. The method of claim 17, wherein the ground frames are formed from sheet metal.

* * * * *

UNITED STATES PATENT AND TRADEMARK OFFICE
CERTIFICATE OF CORRECTION

| | | |
|---|---|---|
| PATENT NO. | : 7,040,934 B2 | Page 1 of 1 |
| APPLICATION NO. | : 10/324941 | |
| DATED | : May 9, 2006 | |
| INVENTOR(S) | : Ling et al. | |

It is certified that error appears in the above-identified patent and that said Letters Patent is hereby corrected as shown below:

In column 4, at line 48, after "reduce" insert --crosstalk on the same side of the add-in card 600. In particular, when the ground pads 608 mate with the ground pins 404, the connection isolates the signal--.

In column 4, at line 49, delete "sucstantially" and insert --substantially--.

Signed and Sealed this

Fourth Day of December, 2007

JON W. DUDAS
*Director of the United States Patent and Trademark Office*